United States Patent [19]
Tatosian et al.

[11] Patent Number: 5,216,672
[45] Date of Patent: Jun. 1, 1993

[54] PARALLEL DIAGNOSTIC MODE FOR TESTING COMPUTER MEMORY

[75] Inventors: David A. Tatosian, Stow; Donald W. Smelser, Bolton; Paul M. Goodwin, Littleton, all of Mass.

[73] Assignee: Digital Equipment Corporation, Maynard, Mass.

[21] Appl. No.: 872,976

[22] Filed: Apr. 24, 1992

[51] Int. Cl.$^5$ .............................................. G06F 11/26
[52] U.S. Cl. .................................. 371/21.1; 371/21.6
[58] Field of Search .................... 371/21.1, 21.2, 21.6; 324/73 R; 365/201

[56] References Cited

U.S. PATENT DOCUMENTS 4,782,486 11/1988 Lipcon et al. ........................ 371/21
4,788,684 11/1988 Kawaguchi et al. ............... 371/21.6
5,148,398 9/1992 Kohno .................................. 371/21.1

Primary Examiner—Vincent P. Canney
Attorney, Agent, or Firm—Arnold, White & Durkee

[57] ABSTRACT

A memory testing system for an electronic computing system includes multiple memory modules, each equipped with error detecting and correcting (EDC) circuitry, and is operable in a diagnostic test mode wherein read and write tests of the modules are performed in parallel. Each module includes a command/status register (CSR), used in identifying errors occurring in that module by capturing various signals at the time of the error. These signals include the type of error, the memory address involved in the error, the check bits of the data associated with the error, and the syndromes of the data. After pre-setting each CSR's diagnostic register, one module operates in a "target" mode, and the remaining modules operate in a "shadow" mode. The target module operates normally during read and write operations. When the target module is directed to write data to a particular address, the shadow modules write the same data to corresponding addresses in their memory banks. When the target module is given a read command, the shadow modules read data from the corresponding addresses of their memory banks; however, the shadow modules do not place this data on the CPU bus. By polling the CSRs, the CPU can obtain detailed information regarding memory errors, such as the type and cause of the errors, and the identity of the module where the errors occurred.

24 Claims, 4 Drawing Sheets

PARALLEL DIAGNOSTIC MODE FOR TESTING COMPUTER MEMORY

BACKGROUND OF INVENTION

The present invention relates to a system for testing random access memory (RAM) of an electronic computing system. More specifically, the invention involves an electronic computing system having multiple RAM modules, each equipped with error detecting and correcting (EDC) circuitry. The system is operable in a diagnostic test mode wherein read and write tests of the RAM modules are performed in parallel.

2. Description of Related Art

One of the most important features of most electronic computing systems ("computers") is their memory. Typically the term "memory" is used in the field of computers to refer to a computer's volatile memory, otherwise known as random access memory (RAM). Most computers include one or more testing routines for determining whether its RAM is correctly reading and writing data. In many cases, a computer will perform these tests soon after power is initially applied to the computer, or soon after the computer is reset. After performing such tests, the computer resumes normal operations, which include executing programs selected by the user of the computer. Many computers also perform such tests at selected times during their normal operation, separate from any power-down or reset operation.

The storage capacity of commercially available memory units is constantly increasing. Accordingly, memory tests of larger memory units requires more time to complete. If the time involved in testing a computer's memory becomes too great, the testing may interfere with the execution of the computer's programs.

One approach that has been used to decrease the time involved in testing computer memories is presented in U.S. Pat. No. 4,782,486, issued Nov. 1, 1988, entitled "Self-Testing Memory", in the names of Jesse B. Lipcon et al., and assigned to the assignee of the present invention. The Lipcon et al. approach involves a self-testing memory that simultaneously writes a test pattern into plural memory banks, simultaneously compares the contents of one of the memory banks with the contents of the other banks, and records errors when the contents of one memory bank differ from the contents of the other banks.

The Lipcon et al. approach is quite useful for its intended purposes in many applications. Its improved utility, however, remains subject to inefficiencies which may be a problem in certain applications. Thus, in the memory read tests of Lipcon et al., all memory banks read data in parallel, but only one memory bank reports the data to the central processing unit (CPU). A data transceiver compares the data read by the non-reporting memory banks to that reported by the reporting memory bank to determine whether an error has occurred in any of the banks. If no discrepancy is detected, the test is both quick and efficient; however, if a discrepancy is detected, it is not immediately apparent whether the error occurred in the reporting memory bank or a non-reporting memory bank.

Another potential limitation is that, although Lipcon et al. recognize and count memory errors, certain other detailed information regarding the type of error is not supplied. Further, Lipcon et al. do not provide a means for temporarily stopping a memory test when an error has occurred. Thus, to determine the type and cause of memory errors that occur during a memory test of Lipcon et al., one must wait until the test has been completed, and then re-test each of the memory banks. Accordingly, although the Lipcon et al. system offers substantial advantages, the system remains subject to improvement. More particularly, it would be advantageous to have a computing system that more quickly provides more complete information about memory errors. It would also be beneficial to reduce CPU involvement in memory tests, and to more quickly and clearly identify memory units in which errors have occurred.

BRIEF SUMMARY OF INVENTION

The present invention is directed at the problems set forth above. In a general aspect, the invention comprises an apparatus for testing multiple memory modules connected in parallel to a CPU bus.

Each of the modules includes one or more memory banks, a control unit, a command/status register, and EDC circuitry. Each module is electrically connected to a plurality of different lines of a CPU bus, for transmitting and receiving electrical signals to and from the CPU. For example, each module's EDC circuitry is electrically connected to error lines of the CPU bus to indicate whether an error has occurred. Moreover, each module is electrically connected to a stall line to place the CPU in a temporary wait state, to facilitate activities such as memory refresh operations of the modules' memory banks.

Each module's command/status register contains a diagnostic register comprising a "target/shadow mode bit" and a number of "base address bits". To configure the system of the invention prior to performing diagnostic tests of the modules' memory banks, a digital 0 is stored in the target/shadow mode bit of one module, and digital 1's are stored in the target/shadow mode bits of the remaining modules. The module whose target/shadow mode bit contains a digital 0 is referred to as the "target" module; the remaining modules are "shadow" modules. The base address of the target module is stored in the "base address bits" of the shadow modules, diagnostic registers.

Then, the CPU directs the "target" module to write a test pattern of data into its respective memory banks. The "shadow" modules utilize the base address stored in their "base address bits", and thus follow the target module by writing the same test pattern into corresponding addresses of their memory banks.

Then, the target module is directed by the CPU to read data from the addresses to which the test pattern was earlier written, and to place this data on the CPU bus. The shadow modules utilize the base address stored in their "base address bits", and thus the follow the target module by reading data from the corresponding addresses of their memory banks. However, the shadow modules do not place this data on the CPU bus.

Each module's EDC circuitry detects errors that occur in the diagnostic memory test of that module, and records signals representative of the errors in the module's command/status register. By polling the memory modules one at a time, the CPU can collect such signals, and thus obtain detailed information concerning memory errors that occurred during the diagnostic tests.

The present invention provides more detailed information regarding memory errors than prior systems, since each memory module of the invention includes individual EDC circuitry. Moreover, the invention reduces the amount of work performed by the CPU since error checking is performed by the local EDC circuits. The invention clearly identifies the memory module in which the error has occurred without requiring time consuming re-testing of memory modules. The invention facilitates faster memory testing, since the invention obviates the need to poll memory modules to determine whether a memory read or write error has occurred. In particular, memory testing in accordance with the present invention can be automatically paused when an error signal is received by one of the EDC circuits.

DESCRIPTION OF DRAWINGS

The nature of the invention, as well as objects and advantages thereof, will become more apparent to those skilled in the art after consideration of the following detailed description in connection with the accompanying drawings, in which like reference numerals designate like parts throughout, wherein.

DESCRIPTION OF A PREFERRED EMBODIMENT

Memory Modules

Figure 1:
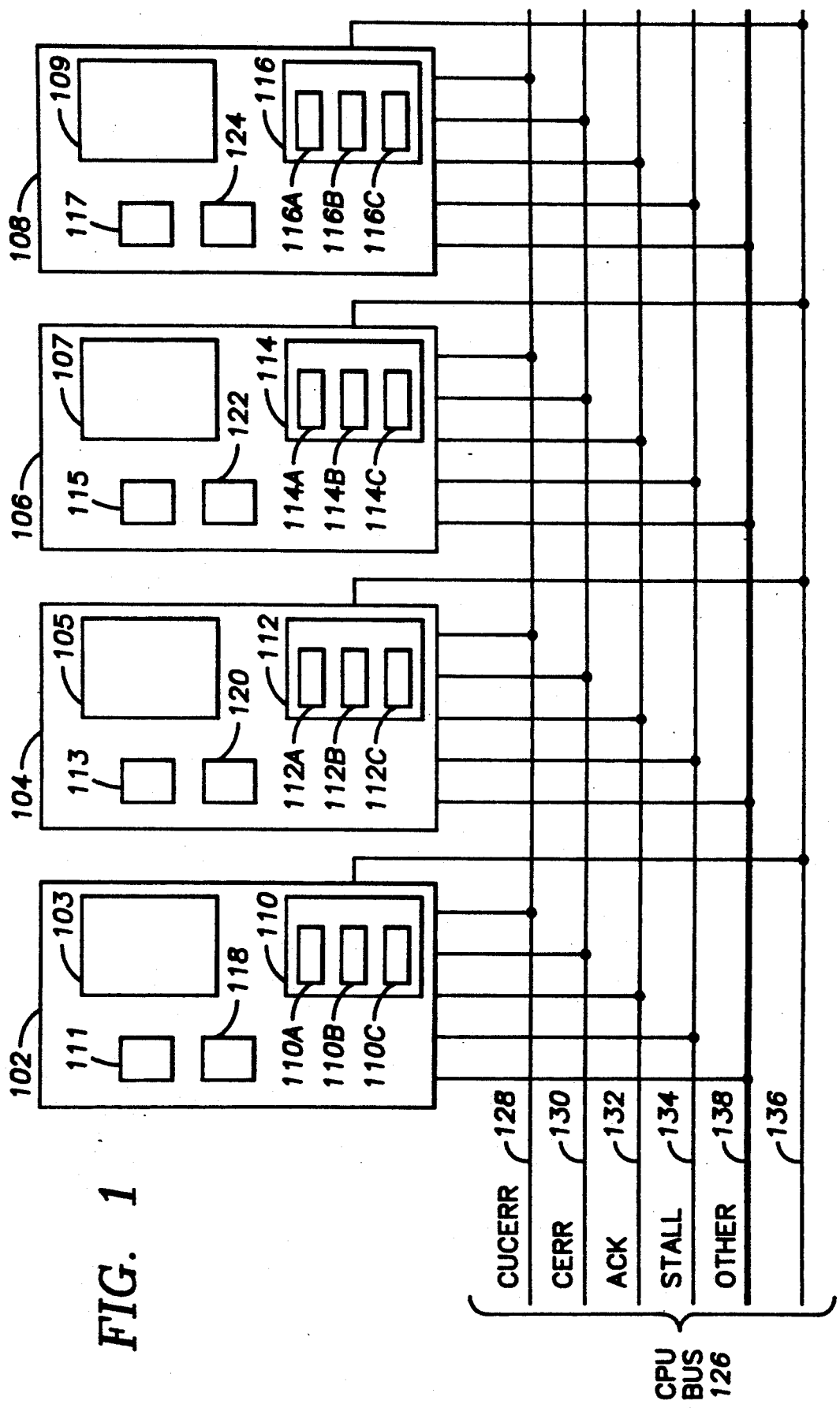
FIG. 1 is an electrical schematic diagram illustrating memory modules 102, 104, 106, 108 and their electrical interconnection to a CPU bus 118, in accordance with the present invention.

Referring to FIG. 1, the invention in an exemplary, preferred embodiment includes first, second, third, and fourth memory modules 102, 104, 106, and 108. In this embodiment, each memory module is depicted as having four banks of dynamic random access memory (DRAMs). Specifically, the module 102 includes memory banks 103, the module 104 includes memory banks 105, the module 106 includes memory banks 107, and the module 108 includes memory banks 109. "Memory bank" refers to the smallest independently addressable unit of memory. Although FIG. 1 shows four memory modules, it is understood that this number is used for explanatory purposes, and a computing system utilizing the present invention is not limited to four memory modules.

Each memory module further includes an DC circuit, the operation of which is described in great detail below. Specifically, first, second, third, and fourth EDC circuits 110, 112, 114, and 116 are provided, wherein each EDC circuit corresponds to a particular memory module. Each EDC circuit includes a check bit generator, an error detecting circuit, and an error correcting circuit. For example, the EDC circuit 110 includes a check bit generator 110a, an error detecting circuit 110b, and an error correcting circuit 110c.

Each module 102, 104, 106, and 108 further includes control units, the function of which is described more fully below. The invention includes first, second, third, and fourth control units 111, 113, 115, and 117. Each module 102, 104, 106, and 108 further includes a command/status register (CSR), the function of which is described in greater detail below. The invention includes first, second, third, and fourth CSRs 118, 120, 122, and 124. Each CSR may contain a plurality of memory registers (not shown) that are described more fully below.

Each of the modules 102, 104, 106, and 108 is electrically connected to a CPU bus 126 which is electrically connected to the CPU (not shown). The CPU bus 126 includes a plurality of lines, including a CUCERR line 128, a CERR line 130, an ACK line 132, a STALL line 134, and a number of address lines 136. The CPU bus 126 typically also includes a plurality of other lines, generally referred to by reference numeral 138.

The memory modules are electrically connected to the CUCERR line 128, CERR line 130, and the STALL line 134 via "open drain" connections. As understood by ordinarily skilled artisans, when a plurality of circuit components are connected to a line via open drain connections, the line carries a high voltage signal unless any one or more of the components asserts a signal on that line, such a signal being in the form of a low voltage signal. The functions of the CUCERR line 128 and the CERR line 130 are described in greater detail below. The purpose of the STALL line 134 is provide one or more of the memory modules 102, 104, 106, and/or 108 the opportunity to temporarily place the CPU in a wait state. In other words, if one or more of the memory modules 102, 104, 106, and/or 108 are engaged in an operation, i.e. are "busy", the busy modules may assert a stall request on the STALL line 134, causing the CPU to delay sending further memory instructions until the stall request is removed. Stall requests are used with DRAMs, for example, when one or more memory modules are performing memory refresh operations, to maintain syncronous operation of the memory modules.

In contrast to the open drain STALL line 134, a "tri-state" connection is used to electrically connect the memory modules 102, 104, 106, 108 to the ACK line 132. When a circuit component is connected to a line via tri-state connections, the line provides a high impedance and carries no voltage signal, unless the component asserts a high or low voltage signal. A tri-state connection is especially desirable in this case since it provides signals with well-defined edges. The purpose of the ACK line 132 is to enable the memory modules 102, 104, 106, and 108 to acknowledge receipt of a memory read or write command issued by the CPU. The ACK line 132 receives signals from the memory modules 102, 104, 106, and 108 one at a time through their respective tri-state connections. This acknowledgement is accomplished when the control unit 111, 113, 115, or 117 of the appropriate memory module 102, 104, 106, or 108 places a high voltage signal on the ACK line 132. However, the memory read or write command is not properly received, due to a condition such as a parity error or the like, the memory module 102, 104, 106, or 108 will place a low voltage signal on the ACK line 132, indicating a "NACK" or "negative acknowledgement" signal. An "ACK" or "positive acknowledgment" signal indicates proper receipt of a command issued by the CPU, and is associated with a high voltage on the ACK line. Only one acknowledge signal is received at a time during normal operation of the memory modules 102, 104, 106, and 108, since memory read and write commands are individually issued to the modules 102, 104, 106, and 108.

Command/Status Registers — Structure

Figure 2:
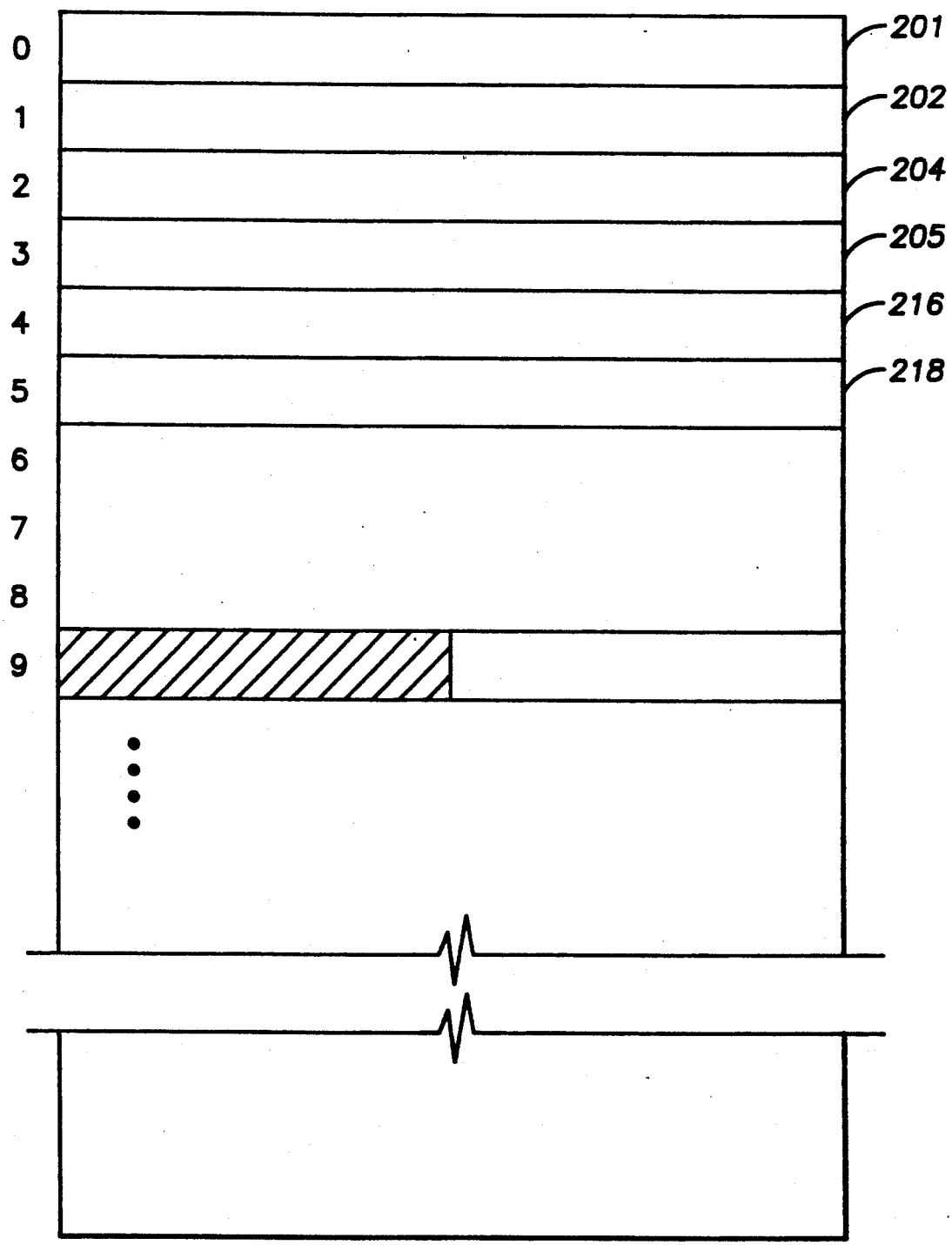
FIG. 2 is a diagram representing the contents of a typical command/status register of the present invention.

Referring to FIG. 2, memory registers 200 of the CSR 118 will be described. Since CSRs 118, 120, 122, and 124 are substantially identical, the following description of the CSR 118 will be understood to be exemplary of the CSRs 120, 122 and 124. Basically, the registers 200 of the CSR 118 operate to store various signals in the event the memory module 102 experiences an error. Each register is represented by a horizontal row, and corresponds to a single address. In the described embodiment, each register is assumed to contain 32 bits, and comprises multiple data storage elements such as "flip-flops". The memory registers 200 include an error register 201, a first command trap 202, a second command trap 204, a diagnostic register 205, an EDC status register 216, and an EDC syndrome register 218.

Logic Circuits — Structure

Figure 3:
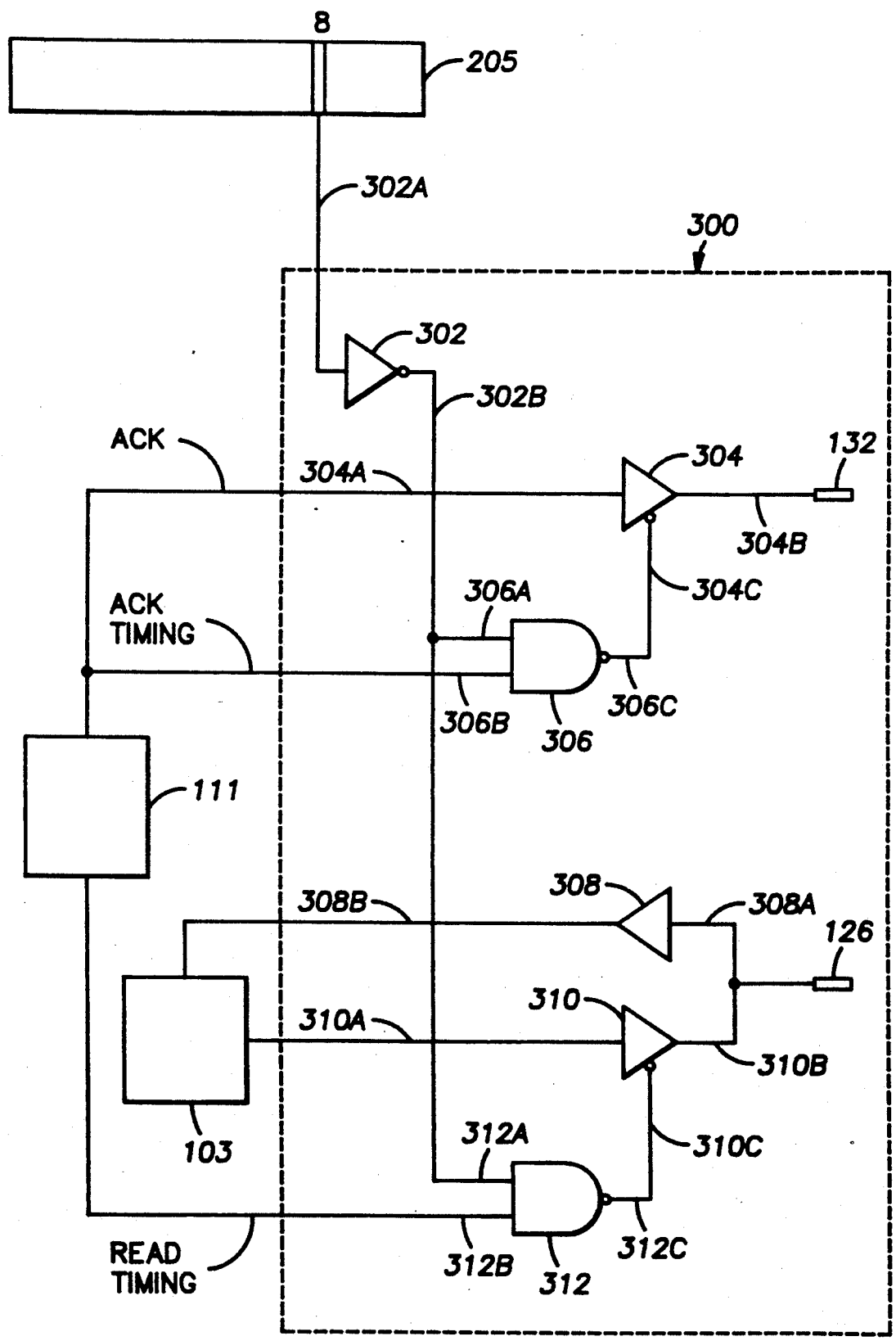
FIG. 3 is an electrical schematic diagram illustrating a diagnostic logic circuit 300 of the present invention.

Each of the memory modules 102, 104, 106, and 108 includes certain logic circuitry. In particular, FIG. 3 shows a logic circuit 300 that is associated with the memory module 102. Since the logic circuit of each of the memory modules 102, 104, 106, and 108 is substantially identical, the following description of the logic circuit 300 will also be understood to be exemplary of the memory modules 104, 106, and 108.

The logic circuit 300 includes an inverting amplifier 302 having an input 302a and an output 302b. The input 302a receives a signal comprising the contents of bit 8 of the register 205 of the CSR 118. The circuit 300 also includes a first amplifier 304, having an input 304a, an output 304b, and an enable input 304c. The input 304a is received from the control unit 111; the output 304b is electrically connected to the ACK line 132; the enable input 304c is received from an output 306c of a NAND gate 306. A first input 306a to the NAND gate 306 is electrically connected to the output 302b, and a second input 306b to the NAND gate 306 is electrically connected to the control unit 111.

A second amplifier 308 is provided, having an input 308a electrically connected to the CPU bus 126, and having an output 308b electrically connected to the memory banks 103. A third amplifier 310 is provided, having an input 310a electrically connected to the memory banks 103, having an output 310b electrically connected to the CPU bus 126, and having an enable input 310c. The logic circuit 300 further includes a NAND gate 312 having a first input 312a electrically connected to the output 302b, a second input 312b electrically connected to the control unit 111, and an output 312c electrically connected to the enable input 310c.

EDC Circuits — Write Operation

Since the EDC circuits 110, 112, 114, and 116 are substantially identical, the following description of the operation of the EDC circuit 110 will also be understood to be exemplary of the EDC circuits 112, 114, and 116. During a typical write operation, the EDC circuit 110 receives a data word from the bus 126. The data word comprises information that the CPU (not shown) has placed on the CPU bus 126 for storage in the memory 102. The check bit generator 110a of the EDC circuit 110 calculates a number of check bits based upon the data word. In the described embodiment, the check bit generator 110a preferably comprises a parity tree arrangement. The calculation of write check bits using parity trees is well known in the prior art, and is therefore not discussed in detail here. The check bits are stored in the module 102.

EDC Circuits — Read Operation

During a typical read operation, the error detecting circuit 110b receives from the memory 102 a stored data word and any stored check bits associated with that data word. The error detecting circuit 110b employs a parity tree arrangement to determine whether the check bits received properly correspond to the data word received. If an error is detected, the circuit 110b generates a syndrome, which is used by the error correcting circuit 110c to correct the error detected by the circuit 110b. The syndrome indicates, for example, which bits of the data were found to be erroneous. Furthermore, the error detecting circuit 110b identifies the memory bank (not shown) in which the read error occurred, and provides a signal identifying that memory bank.

Another function of the error detecting circuit 110b is to determine whether the memory read error that has been detected is a correctable error; if the read error is correctable, a low voltage signal is placed on the CERR line 130. On the other hand, if the read error is un-correctable, a low voltage signal is placed on the CU-CERR line 128.

Command/Status Registers — Operation

Basically, the CSR 118 assists in identifying errors occurring in the module 102, by capturing various signals present in the computer at the time of the error. The CSR 118 is provided with information such as: an indication of what type of error occurred, the memory address that was being written to or read from when the error occurred, the check bits associated with the data that was being written to or read from memory when the error occurred, and the "syndromes" associated with the data.

The CSR 118 is made up of RAM, such that when a new error occurs, the signals associated with the new error are written to the registers 200 in place of the previous contents of the registers 200. For example, when an error occurs, the error register 201 receives a plurality of signals from various error-indicating circuits (not shown) associated with the memory module 102. This information might include the erroneous data,s parity, start bit, stop bit, and the like. When an error occurs, assuming a word on the CPU bus 126 has 64 bits, the first command trap 202 receives bits 0–31 of the signal that was present on the CPU bus 126 when the error occurred. Similarly, the second command trap 204 is filled with bits 32–63 of the signal present on the CPU bus 126 when the error occurred. Bits 32–63 ma contain information such as additional data, a command, and a code identifying the processor that sent the signal on the CPU bus 126. The EDC status register 216 will receive check bits that were generated by the check bit generator 110a in conjunction with the data associated with the error. The EDC syndrome register 218 contains the syndrome produced by the error detecting circuit 110b in response to the memory error.

In contrast to the error registers described above, the diagnostic register 205 is not changed when an error is detected. The diagnostic register 205 is set in advance of any error being detected, by writing to the CSR 118. By setting certain bits in the diagnostic register 205, the module 102 is ordered to operate in either a "target" or a "shadow" mode. These modes are described in greater detail below. The bits of the diagnostic register 205 may be designated as shown in Table I, below.

TABLE I

| Diagnostic Register 205 | |
|---|---|
| 8 | target/shadow mode |
| 22 | base address, bit 0 |
| 23 | base address, bit 1 |
| 24 | base address, bit 2 |
| 25 | base address, bit 3 |
| 26 | base address, bit 4 |
| 27 | base address, bit 5 |
| 28 | base address, bit 6 |
| 29 | base address, bit 7 |
| 30 | base address, bit 8 |

Bit 8 determines whether the memory module 102 will operate in the target mode or shadow mode. A digital 0 in bit 8 of the register 205 specifies the target mode, and a digital 1 specifies the shadow mode. Bits 22-30 of the register 205 are used to identify the base address of the memory module that is to be operated in the target mode. For example, when the memory module 102 is operated as the target module, while the memory modules 104, 106, and 108 are operated in the shadow mode, bits 22-30 of all diagnostic registers are set to the same base address as the module 102; thus, the modules 104, 106, and 108 (i.e., the shadow modules) mirror actions of the module 102 (i.e., the target module), by reading and writing data from their memory banks 105, 107, and 109, in response to commands on the CPU bus 126 intended for the module 102.

Control Units

Generally, the control unit 111 is a state machine that coordinates the operations of the memory module 102. For example, when a write timing signal from the control unit 111 is provided to the CSR 118, this determines when the CSR 118 is able to store signals associated with errors that occur during the reading or writing of data to the memory banks 103. In particular, the control unit 111 provides a "CSR write timing signal" that is used to clock the storage of data in the "flip-flops" of the CSR 118. Additionally, the control unit 111 provides a read timing signal, which enables the memory banks 103 to read data onto the bus 126. Also, the control unit 111 provides a high voltage signal on the ACK line 132 to acknowledge read and write signals received from the bus 126; in addition, the control unit 111 provides an ACK timing signal.

Logic Circuits — Operation

The inverting amplifier 302 provides an output opposite that of the contents of bit 8 of the register 205. The NAND gate 306 performs a NAND operation upon the inverted contents of bit 8 of the register 205 and the ACK timing signal provided by the control unit 111. If bit 8 is equal to digital 1, indicating shadow mode operation, the output of the NAND gate 306 will be digital 1 irrespective of the signal provided on the input 306b. However, if bit 8 is equal to digital 0, indicating target mode operation, the output of the NAND gate 306 will be digital 0 when the control unit 111 provides an ACK timing signal. When the output 306c is digital 0, the first amplifier 304 is enabled, thus permitting the amplifier 304 to pass an ACK signal received by the control unit 111. Thus, the NAND gate 306 and amplifier 304 operate to effectively prevent the memory module 102 from placing a signal on the ACK line unless the memory module 102 is in the target mode.

The second amplifier 308 operates to pass write data from the CPU bus 126 to the memory banks 103. The write function of the module 102 is unaffected by the selection of either a target or a shadow mode. However, the read function of the module 102 is inhibited if the module 102 is in the shadow mode. Specifically, the third amplifier 310 only passes data read from the memory banks 103 to the CPU bus 126 in the event the enable input 310c is digital 0. The enable input 310c is only digital 0 when the inputs 312a and 312b are digital 1. Accordingly, the memory module 102 is only permitted to place read data on the CPU bus 126 when the memory module is in the target mode, and a read timing signal is received from the CPU bus 126.

Operating Sequence

Figure 4:
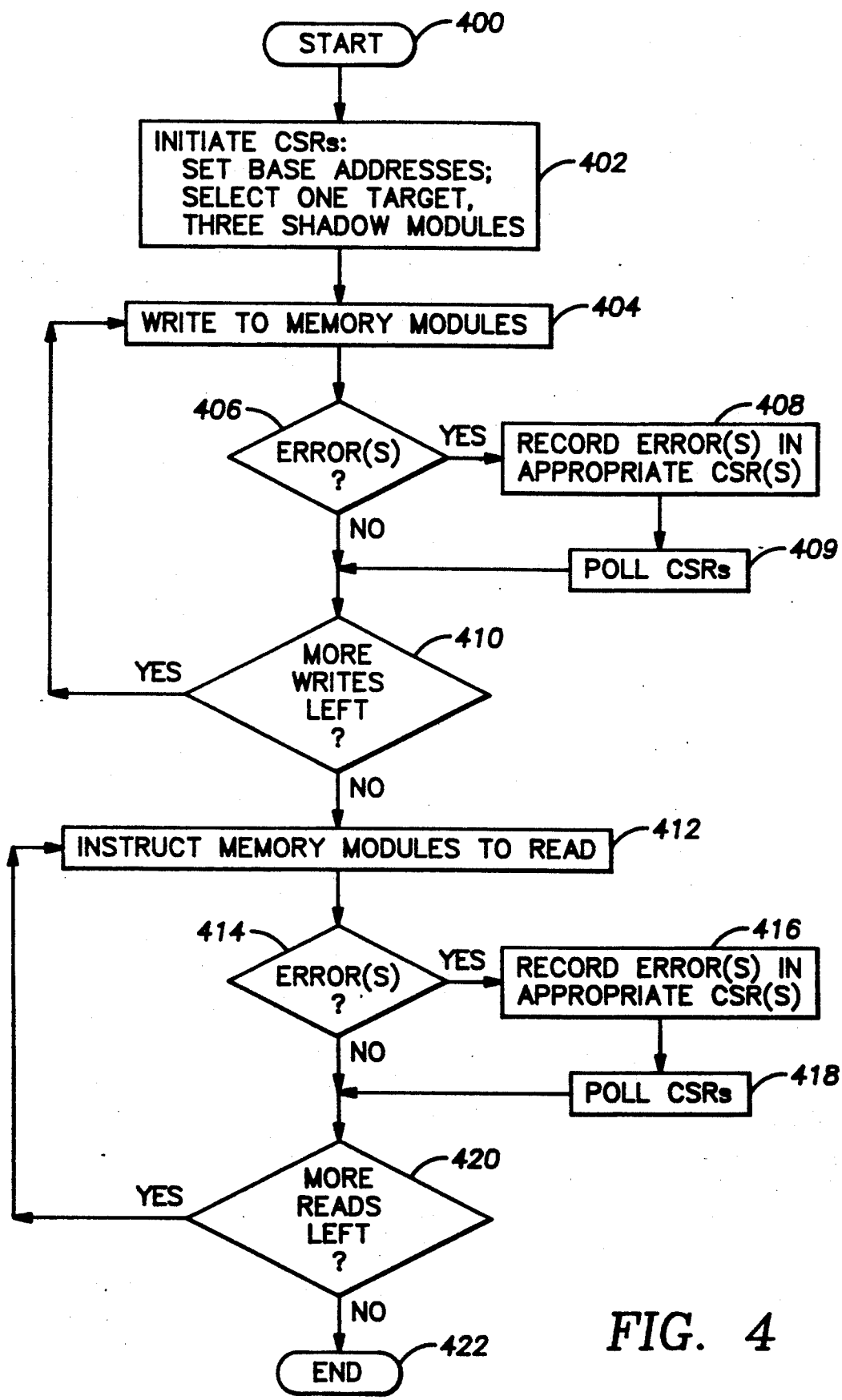
FIG. 4 is a flow chart illustrating, in general terms, a memory testing sequence of the present invention.

The operating sequence of the invention will now be described in greater detail. In that regard, the present invention may be used in a variety of applications to test computer memory. For example, it is often desirable to perform a memory test soon after power is applied to the computer, or when the computer is reset. Such a test may be conducted in accordance with the general sequence of FIG. 4.

After the test sequence is initiated in task 400, the CPU in task 402 prepares the memory modules 102, 104, 106, and 108 for operation in either a target mode or a shadow mode. In particular, the CPU sets bit 8 of each module's error register to a digital 1 or a digital 0, depending upon whether that particular module is to be operated as a target module or a shadow module. For example, if the module 102 is to be operated in the target mode, a digital 0 will be stored in bit 8 of the register 205; however, if the module 102 is to be operated in the shadow mode, a digital 1 will be stored in bit 8 of the register 205. During diagnostic testing, only one memory module operates in the target mode, while the other memory modules operate in the shadow mode.

Also in task 402, the CPU stores the base address of the target memory module in bits 22-30 of each memory module's diagnostic register. Normally, each memory module is assigned a different "base address", which is the first address of that memory module. A memory module that is operating in the shadow mode will use the base address stored in bits 22-30 of its diagnostic register. As mentioned above, this base address is identical to the base address of the target memory module. As a result, when the CPU sends read and write instructions to the target memory module, the shadow modules also respond by performing the instructions.

Following the initiation of the memory modules in task 402, in task 404 the CPU instructs the target memory module to write preselected data to memory registers of the target memory module for which testing is desired. The pre-selected data serves as a test pattern to test the storage ability of the memory banks. Additionally, since the shadow memory modules have been assigned the same base address as the target memory module, the shadow modules write the data to memory locations corresponding to those of the target module. Since the amplifier 304 passes write data irrespective of the value of bit 8 of the diagnostic register, each memory module fully complies with the write instruction regardless of whether that module is a target or a shadow module.

In query 406, the individual error detecting circuit of each memory module determines whether that module has experienced a memory write error. If so, task 408 stores information about that error is stored in the CSR of that memory module. Then, the CPU in task 409 polls each memory module's CSR for information about any errors that occurred during the write testing. Since each CSR records errors specific to that memory module, the CPU is able to precisely identify the specific module or modules in which errors occurred, as well as the type and cause of the errors.

After task 409, query 410 determines whether additional write operations are to be performed in the memory test. If so, control returns to task 404. However, if all write operations in the memory test have been completed, the task 412 is performed. In task 412, the CPU instructs the target memory module to read data from a pre-determined address. Additionally, since the shadow memory modules have been given the same base address as the target memory module, the shadow modules read data memory locations corresponding to the target module. However, since the amplifier 306 only passes the data read by a memory module if bit 8 of that module's diagnostic register contains a digital 0, only the target module will place data on the CPU bus 126. In contrast, the modules operating in the shadow mode will not place any data on the CPU bus 126.

Then, in query 414, the individual error detecting circuit of each memory module determines whether that module experienced a memory read error. If so, task 416 is performed, wherein each module's CSR is filled with information about the error that occurred in that module. Then, in task 418, the CPU polls the CRSs 118, 120, 122, and 124 for information about any errors that occurred during the read testing. Since each CSR records errors specific to a particular memory module, the CPU is able to precisely identify the specific module or modules in which errors occurred, as well as the type and cause of the errors.

After task 418, query 420 determines whether additional read operations are to be performed in the memory test. If so, control returns to task 412. However, if all read operations in the memory test have been completed, the routine ends in task 422.

The present invention provides a number of advantages over prior arrangements. In particular, the present invention provides more detailed information regarding memory errors than prior systems, since the invention includes individual EDC circuits 110, 112, 114, and 116, for memory modules 102, 104, 106, and 108. Moreover, the invention reduces the amount of work performed by the CPU since error checking is performed by the local EDC circuits. In contrast to prior systems, the present invention clearly identifies the memory module in which the error has occurred without requiring time consuming re-testing of memory modules. The invention facilitates faster memory testing, since the invention obviates the need to poll memory modules to determine whether a memory read or write error has occurred. In particular, memory testing in accordance with the present invention can be automatically paused when signals are received on the CUCERR line 128 or the CERR line 130.

While there have been shown what are presently considered to be preferred embodiments of the invention, it will be apparent to those skilled in the art that various changes and modifications can be made herein without departing from the scope of the invention as defined by the appended claims.

What is claimed is:

1. An electronic computing system, comprising:
   plural memory modules electrically attached to a CPU bus, each memory module having a normal base address, wherein each memory module includes:
   error detecting circuit;
   a command/status register that includes:
      at least one storage register to store information associated with a memory error in the memory module;
      a diagnostic register including multiple base address bits and a target/shadow mode bit;
   a logic circuit, responsive to the target/shadow mode bit to;
      place the memory module in a target mode wherein the memory module performs read and write operations in accordance with commands received from the CPU bus and directed to the normal base address of the module, or alternatively to
      place the memory module in a shadow mode wherein the memory module adopts a base address specified in the base address bits and performs read and write operations in accordance with commands received from the CPU bus and directed to said adopted base address, with data read in the shadow mode being suppressed from placement on the CPU bus.

2. The system of claim 1, wherein the base address specified in the base address bits is the base address of a single memory module that is operated in the target mode.

3. The system of claim 1, wherein the CPU bus includes a STALL line for the memory modules to temporarily place a CPU electrically connected to the CPU bus in a wait state.

4. The system of claim 3, wherein the STALL line is electrically connected to the memory modules in open drain fashion.

5. The system of claim 1, wherein the CPU bus includes an ACK line for the memory modules to acknowledge commands directed to those memory modules.

6. The system of claim 5, wherein the ACK line is electrically connected to the memory modules in tri-state fashion.

7. The system of claim 1, wherein each module further includes a control unit to provide timing signals for that module.

8. Apparatus for testing a plurality of memory modules connected in parallel to a CPU bus, wherein each module includes at least one memory bank, comprising:
   a first circuit operable to place
      (1) one of the modules in a target mode wherein the module has a base address and is capable of storing a test pattern in a position in its memory and of reading the test pattern from such position;
      (2) each other module in a shadow mode wherein such other module has the same base address as the target module and stores the test pattern in a position corresponding to the storage position of the test pattern in the target mode;
   a separate error detector for each module operable to detect error in the test pattern as read from the memory of its respective module; and a separate register for each module operable to store signals contained in that module at the time the error is detected.

9. The system of claim 8, wherein the CPU bus includes a STALL line for the memory modules to temporarily place a CPU electrically connected to the CPU bus in a wait state.

10. The system of claim 9, wherein the STALL line is electrically connected to the memory modules in open drain fashion.

11. The system of claim 8, wherein the CPU bus includes an ACK line for the memory modules to acknowledge commands directed to those memory modules.

12. The system of claim 11, wherein the ACK line is electrically connected to the memory modules in tri-state fashion.

13. The system of claim 8, wherein each module further includes a control unit to provide timing signals for that module.

14. The system of claim 8, further including a diagnostic register, wherein the first circuit places the modules in the target or shadow modes depending upon the contents of the diagnostic register.

15. The system of claim 8, further including a diagnostic register, wherein the shadow modules receive the base address of the target module from the diagnostic register.

16. A method of testing multiple memory modules connected in parallel to a CPU bus, comprising:
writing the same test pattern into corresponding addresses in the memory of each module;
in each memory module, reading the contents of the addresses written to;
in each memory module, detecting discrepancy, if any, between the test pattern and the contents read from the addresses written to;
in each memory module, registering signals contained in that module at the time the error is detected; and
reading the registered signals from the modules onto the CPU bus.

17. The method of claim 16, wherein the registered signals are read onto the CPU bus from the modules one module at a time.

18. The method of claim 16, further comprising the steps of: placing the contents of the read data of one of the memory
modules on the CPU bus, said module being referred to as the target module; and
suppressing placement of read data onto the CPU bus in the case of the remaining memory modules, said remaining modules being referred to as the shadow modules.

19. The method of claim 18, wherein each module receives a signal from the diagnostic register contained in that module to designate that module as a target module or a shadow module.

20. A method of testing multiple modules of memory which comprises:
establishing one module as a target module normally capable of receiving and transmitting data, and the remainder of the modules as shadow modules normally capable of storing data but not transmitting data;
storing the base address of the target module in each shadow module as the base address of each shadow module;
writing the same test pattern to the target module and to each shadow module in corresponding addresses in all of the modules;
querying the corresponding addresses of each module for error;
registering in each module digital signals contained in that module at the time error was detected during the querying of that module; and
polling the registers one at a time for the digital signals registered therein.

21. The method of claim 20, wherein the target memory module and the shadow memory modules are determined in accordance with the contents of diagnostic registers contained in the memory modules.

22. A computer memory testing method, comprising the steps of:
(a) writing data to one or more addresses in a target memory module;
(b) writing data to one or more memory addresses in at least one shadow module, the addresses corresponding to the addresses written to in the target memory module;
(c) for each memory module, storing in a command/status register of said module information concerning errors, if any, occurring in step (b); and
(d) polling one or more of the command/status registers for the stored information.

23. The method of claim 20, wherein the target memory module and the shadow memory modules are determined in accordance with the contents of diagnostic registers contained in the command/status 24. A method for testing plural computer memory modules, comprising the following steps:
instructing a target memory module to read data from one or more memory locations;
instructing each shadow module to read data from memory locations in the shadow module corresponding to the locations read from in the target memory module;
preventing each shadow module from placing data so read onto the bus;
for each memory module, storing in a command/status register of said module information characterizing errors, if any, occurring during the read operation; and
polling the command/status registers to determine the stored characteristics of the errors.

* * * * *

UNITED STATES PATENT AND TRADEMARK OFFICE
CERTIFICATE OF CORRECTION

PATENT NO. : 5,216,672
DATED : June 1, 1993
INVENTOR(S) : David A. Tatosian, Donald W. Smelser, and Paul M. Goodwin It is certified that error appears in the above-indentified patent and that said Letters Patent is hereby corrected as shown below:

Column 2, Line 44 replace "modules," with --modules'--.

Column 3, Line 54 delete "DC" and replace with --EDC--.

Column 6, Line 48 replace "data,s" with --data's--.

Column 6, Line 54, replace "ma" with --may--.

Claim 23, Line 41, insert --registers.-- after "status".

Signed and Sealed this

Eighth Day of March, 1994

*Attest:*

BRUCE LEHMAN

*Attesting Officer*     *Commissioner of Patents and Trademarks*